US012794363B2

(12) United States Patent
Androni

(10) Patent No.: US 12,794,363 B2
(45) Date of Patent: Nov. 10, 2026

(54) OPTICAL AMPLIFICATION APPARATUS FOR A SUBMARINE OPTICAL AMPLIFIER AND RELATED OPTICAL AMPLIFIER

(71) Applicant: SUBPHOTON S.R.L., Cernusco sul Naviglio (IT)

(72) Inventor: Daniele Androni, Cernusco sul Naviglio (IT)

(73) Assignee: SUBPHOTON S.R.L. (IT)

(*) Notice: Subject to any disclaimer, the term of this patent is extended or adjusted under 35 U.S.C. 154(b) by 1024 days.

(21) Appl. No.: 17/999,562

(22) PCT Filed: May 27, 2021

(86) PCT No.: PCT/IT2021/050168
§ 371 (c)(1),
(2) Date: Nov. 22, 2022

(87) PCT Pub. No.: WO2021/245713
PCT Pub. Date: Dec. 9, 2021

(65) Prior Publication Data
US 2023/0216265 A1 Jul. 6, 2023

(30) Foreign Application Priority Data
Jun. 5, 2020 (IT) ........................ 102020000013411

(51) Int. Cl.
*H02M 3/156* (2006.01)
*H02M 1/00* (2007.01)
*H01S 5/042* (2006.01)

(52) U.S. Cl.
CPC ......... *H02M 3/156* (2013.01); *H02M 1/0022* (2021.05); *H01S 5/042* (2013.01)

(58) Field of Classification Search
CPC .... H02M 3/156; H02M 3/158; H02M 1/0016; H02M 1/0022; H02M 1/0019
See application file for complete search history.

(56) References Cited

U.S. PATENT DOCUMENTS

RE38,780 E * 8/2005 Hawkes ................ H02M 3/156 323/285
9,595,866 B2 * 3/2017 Choi ..................... H02M 3/156
(Continued)

FOREIGN PATENT DOCUMENTS

CN 105099149 A * 11/2015
CN 105099149 B 1/2018
CN 107732654 A 2/2018

*Primary Examiner* — Gustavo A Rosario-Benitez

(57) ABSTRACT

An optical amplification apparatus for a submarine optical amplifier, wherein the optical amplification apparatus comprises an optical amplification system, having at least one active component and a DC/DC converter configured to supply the optical amplification system. The DC/DC converter comprises a first commutator and a pulse modulator configured to cyclically switch the first commutator between a closing and an opening configuration. The DC/DC converter further comprises a retroaction circuit comprising, a first differential amplifier connected for receiving, a first signal representative of a voltage at an output a first reference signal, for generating a first error signal based on their difference and a second differential amplifier connected for receiving the first error signal and a second reference signal for generating a second error signal proportional to a deviation of the voltage at the output. The pulse modulator regulates a duty cycle based on the second error signal.

12 Claims, 2 Drawing Sheets

(56) References Cited

U.S. PATENT DOCUMENTS

| | | | | |
|---|---|---|---|---|
| 10,862,389 | B1 * | 12/2020 | Ortiz | H02M 1/15 |
| 2005/0110474 | A1 * | 5/2005 | Ortiz | H02M 1/14 323/282 |
| 2014/0117955 | A1 | 5/2014 | Zoso et al. | |
| 2015/0155784 | A1 * | 6/2015 | Ouyang | H02M 3/1563 323/285 |
| 2020/0127565 | A1 * | 4/2020 | Liang | H02M 3/156 |

* cited by examiner

OPTICAL AMPLIFICATION APPARATUS FOR A SUBMARINE OPTICAL AMPLIFIER AND RELATED OPTICAL AMPLIFIER

TECHNICAL FIELD OF THE INVENTION

The present invention relates to an optical amplification apparatus for a submarine optical amplifier, and a related submarine optical amplifier.

STATE OF THE ART

Submarine amplified optical telecommunication systems are used for the transmission of optical signals between two ground stations placed at very long distance from each other (e.g., 2000-8000 km). Such optical telecommunication systems typically comprise an optical telecommunication line which connects the two stations and which comprises a submarine optical transmission cable along which a plurality of submarine optical amplifiers is distributed, arranged at predetermined distances (e.g., 50-80 km) from each other. Typically, the optical transmission cable comprises a plurality of fibres pairs and an electric conductor for the electric power supplying.

At least at one of the two ground stations of the optical telecommunication system there is a power supplying source of the system (PFE, "Power Feeding Equipment") able to remotely powering each optical amplifier through the electric conductor of the optical transmission cable. Typically, the power supplying is a direct current at high voltage (e.g., 10-15 kV). The power supplying current is typically sized at a constant value, for example between 1 A and 1,2 A, while the power supplying voltage must be sized as a function of the voltage drop on each optical amplifier and due to the impedance of the optical transmission cable—typically equal to about 1 ohm/km. Typically, for minimizing the power supplying voltage (and consequently the power generated for powering the entire line) it is known sizing the telecommunication system so that the total voltage drop on the amplifiers is substantially equal to the voltage drop on the cable pieces between the amplifiers.

Typically, a submarine optical amplifier for optical telecommunication systems comprises a hollow metal vessel (typically made of steel) wherein the optical amplification apparatus for the amplification of the optical signal is housed.

FIG. 1 schematically shows a known configuration of an optical amplification apparatus for a submarine optical amplifier. Typically, the optical amplification apparatus 300 comprises an optical amplification system 302, comprising a plurality of active components (i.e., which require electric power supplying) for the amplification of the optical signal, and a DC/DC converter 303 placed upstream of the optical amplification system 302 for powering the amplification system with a predetermined voltage value. Typically, the optical amplification systems require an input voltage ranging from a few Volts, e.g., about 2-5 V, to a few tens of Volts, e.g., 20-30 Volts.

Typically, a Zener diode 301 is placed upstream of the DC/DC converter 303 and is used in reverse bias for imposing an input voltage to the DC/DC converter that is constant and equal to the Zener voltage value.

The DC/DC converter comprises a first commutator 306, typically a MOSFET transistor, connected to a pulse modulator 307 (e.g., a "Pulse Width Modulation" PWM controller) for cyclically switching with a duty cycle the MOSFET transistor between a closing configuration wherein the transistor behaves like a short circuit and can be passed through by the power supplying current, and an opening configuration wherein the transistor behaves like an open circuit and cannot be passed through by the power supplying current.

For maintaining the input voltage of the optical amplification system (i.e., at the output from the DC/DC converter) at a constant value, the DC/DC converter typically comprises a retroaction circuit 304 comprising a differential amplifier 305 which receives at the negative port (or inverting port) a voltage representative of the output voltage of the DC/DC converter and at the positive port (or non-inverting port) a reference voltage. The differential amplifier 305 generates an error signal representative of the difference between the two input voltages and transmits this error signal to the pulse modulator of the DC/DC converter for adjusting the duty cycle as a function of the error signal.

The duty cycle of the DC/DC converter is a function of the ratio between the input voltage of the DC/DC converter and the output voltage of the DC/DC converter, so that when the output voltage of the converter changes, due for example to a variation in the power required by the optical amplification system, a variation of the input voltage of the DC/DC converter would occur, if this was not stabilized by the Zener diode. This stabilization of the input voltage of the DC/DC converter causes that a variation of the output voltage of the DC/DC converter corresponds to a variation of the duty cycle such as to reverse the variation trend of the output voltage of the DC/DC converter, thus maintaining the latter in a limited range of values.

SUMMARY OF THE INVENTION

In the context of the submarine optical amplification, the Applicant made the following considerations.

First of all, according to the Applicant, both the power supplying current and the power supplying voltage must be suitably sized for not incurring excessive costs due to the cost of the power supplying source, which increases at the increasing of the intensity of the current generated, and/or to the insulation cost of the optical amplifiers, which increases at the increasing of the power supplying voltage of the system, and/or excessive energy dissipations related to the voltage drop along the optical transmission cable and/or to the increase in energy dissipation as heat (Joule effect).

According to the Applicant, the use of the Zener diode as above described causes a loss of power mainly due to two contributions:

- firstly, for effectively stabilizing the input voltage of the DC/DC converter, the Zener diode absorbs part of the power supplying current of the system, typically equal to about 1% (e.g., about 10-12 mA). This percentage of the power supplying current is consequently "dissipated" from an operational point of view of the telecommunication system since it is not available for the power supplying of the optical amplification system;
- secondly, the optical amplification systems (for example mainly the lasers contained in them) tend over time to undergo an aging which causes an increase in the power required by the optical amplification system for operation (for example the required power can increase in the order of 15-20% from the beginning of life to the end of life). This required power can be estimated as the product between input voltage of the optical amplification system, which is a value kept constant thanks to the retroaction circuit, and current absorbed by the optical amplification system, which, instead, is a contribution that increases with the aging of the optical amplification system. Therefore, the optical amplification apparatus has to be sized in such a way as to absorb a power value equal to the maximum power value that the optical amplification system may require during its operation (i.e., at the end of life). To do this, the Zener diode must be oversized for being able to ensure the aforesaid maximum power required by the optical amplification system. This results in a power dissipation in the starting operating periods of the optical amplification system since the Zener diode absorbs the excess power not used by the optical amplification system.

In a submarine line of great distance and high capacity, with a high number of amplifiers, high output power of the amplifiers and high fibres count (for example 24-98), the electric power required for the power supplying of the system is a critical parameter. Under these conditions, the two aforesaid power losses significantly affect the efficiency of the telecommunication system.

The Applicant has therefore faced the problem of providing an optical amplification apparatus for a submarine optical amplifier having a higher electric efficiency with respect to the known optical amplification apparatuses based on the use of a Zener diode as stabilizing element of the input voltage of the DC/DC converter.

According to the Applicant, one or more of the above problems are solved by an optical amplification apparatus for a submarine optical amplifier and by a submarine optical amplifier according to the attached claims and/or according to one or more of the following aspects.

According to an aspect the invention relates to an optical amplification apparatus for a submarine optical amplifier, the optical amplification apparatus comprising an optical amplification system, comprising at least one active component, and a DC/DC converter connected to supply said optical amplification system.

Preferably said DC/DC converter comprises a first commutator and a pulse modulator connected to the first commutator for cyclically switching with a duty cycle said first commutator between a closing configuration, in which it can be passed thought by a current, and an opening configuration, in which it cannot be passed thought by the current.

Preferably said DC/DC converter comprises a retroaction circuit which comprises:

a first differential amplifier connected for receiving, at a first input port, a first signal representative of at least a voltage at output from said DC/DC converter and at input into said optical amplification system and, at a second input port, a first reference signal, said first differential amplifier being structured for generating a first error signal representative of a difference between said first signal and said first reference signal;

a second differential amplifier connected to the first differential amplifier for receiving, at a first respective input port, said first error signal and, at a second respective input port, a second reference signal, said second differential amplifier being structured for generating a second error signal representative of a difference between said first error signal and said second reference signal, wherein said second error signal is proportional to a deviation of said voltage at output from said DC/DC converter with respect to a nominal working voltage of the optical amplification system, wherein said first input port of said first differential amplifier and said first respective input port of said second differential amplifier are concordant ports.

Preferably said pulse modulator is connected to said second differential amplifier for receiving said second error signal and for regulating said duty cycle as a function of said second error signal.

According to an aspect the invention relates to a submarine optical amplifier comprising:

a vessel having a housing cavity; and an optical amplification apparatus according to any embodiment of the preceding aspect of the present invention housed in said housing cavity.

The term "optical amplification" (and the like) is not to be understood as restricted to optical amplification only (i.e., increasing in the intensity of the optical signal), but more generally comprises any processing of the optical signal (e.g., routing, regeneration, filtering, etc.) through "active components", i.e., current power supplied components, e.g., electric components (converters, heaters, etc.) or electronic or opto-electronic components (e.g., lasers, photodiodes, etc.).

"Optical amplification system" is a set of electric, electronic, optical and opto electronic components for the processing of the optical signal.

"Concordant ports" are two respective input ports of two different differential amplifiers, where both ports are inverting ports or non-inverting ports. "Inverting port" is the port that, if the other port of the differential amplifier is 6-grounded, generates a polarity inversion of the output voltage of the differential amplifier with respect to the input voltage of such port.

"Duty cycle" (D) refers to the ratio between the time interval in which the first commutator is in the closing configuration and the time interval in which the first commutator is in the opening configuration, in a period of the modulator.

"DC/DC converter" refers to any electronic circuit structured for converting a direct voltage at input to a direct voltage at output.

According to the Applicant, the configuration of the retroaction circuit according to the present invention allows the operation of the optical amplification apparatus even without the Zener diode.

Circling back to the known optical amplification apparatus above described with reference to FIG. 1, an attempt to increase its efficiency by removing the Zener diode, with no other changes, would cause a malfunction of the optical amplification apparatus. Without the Zener diode, the input voltage of the DC/DC converter is no longer stabilized, but changes according to the duty cycle variation, which in turn depends on the fluctuations of the output voltage of the DC/DC converter. In this situation, without the Zener diode, a variation (e.g., a lowering) of the output voltage of the DC/DC converter with respect to the nominal working voltage of the optical amplification system (which is a predetermined design parameter) would generate an error signal such as to command a variation of the duty cycle which would cause a variation of the input voltage of the DC/DC converter concordant with the variation of the output voltage of the DC/DC converter (e.g., also a lowering of the input voltage of the converter). This variation of the input voltage of the DC/DC converter would in turn determine a further variation of the output voltage of the DC/DC converter with respect to the nominal working voltage of the optical amplification system, with the further variation that would be concordant with the first variation of the output voltage of the DC/DC converter (e.g., a further lowering of the output voltage of the converter). In this way, the optical amplification apparatus enters a "positive feedback" circle wherein the duty cycle tends to a limit situation (D=0% or D=100%) such as to bring the output voltage of the converter to a value incompatible with the efficient operation of the optical amplification apparatus.

According to the Applicant, on the other hand, the configuration of the retroaction circuit according to the present invention allows removing the Zener diode while avoiding such positive feedback circle. The two difference operations performed in sequence on the first signal (the first directly performed, the second indirectly performed as performed on the first error signal which depends on the first signal) allow generating an error signal (i.e. the second error signal) able to command, in response to a variation of the voltage at output from the DC/DC converter, a variation of the duty cycle opposite to the duty cycle variation that would have been commanded by the error signal in a known retroaction circuit, as described above. In this way, it is obtained a variation of the voltage at input into the DC/DC converter discordant with respect to the variation of the voltage at output from the DC/DC converter and which allows the voltage at output from the DC/DC converter to be brought back to the nominal working voltage value of the optical amplification system.

According to the Applicant, a configuration of the optical amplification apparatus according to the present invention allows avoiding the use of the Zener diode with consequent improvement of the electric efficiency of the optical amplification apparatus, since the above-described power losses related to the Zener diode are avoided.

Moreover, the removal of the Zener diode allows having a variable voltage at input into the DC/DC converter which allows varying the power absorbed by the optical amplification apparatus according to the power required from time to time by the optical amplification system for operation.

The efficiency increase linked to the possible removal of the Zener diode allows, for example, a reduction in costs for the same distance covered by the telecommunication system as it is possible reducing the power supplying voltage of the system, and/or a coverage of greater distances with the same power supplying voltage of the system (and related costs) as it is possible increasing the number of optical amplifiers along the telecommunication line.

Furthermore, the removal of the Zener diode at the input of the optical amplification apparatus allows improving the reliability of the optical amplification apparatus since a component that can undergo breakage and/or damages which could cause the partial or total dysfunction of the optical amplification apparatus is eliminated.

The present invention in one or more of the aforesaid aspects can have one or more of the following preferred features.

The terms “upstream” and “downstream” refer to a propagation direction of a current, typically oriented by said DC/DC converter towards said optical amplification system.

Preferably said first signal is representative also of a voltage at input into said DC/DC converter, more preferably is representative of a sum of said voltage at output from said DC/DC converter and of said voltage at input into said DC/DC converter. Preferably said retroaction circuit comprises an adder connected to said first differential amplifier for receiving, at a first input port, a second signal representative (only) of said voltage at output from said DC/DC converter and, at a second input port, a third signal representative of a voltage at input into said DC/DC converter. Preferably said adder is structured to operate an elaboration, more preferably a sum, of said second and third signal and generate said first signal as a function of said elaboration, more preferably of said sum, of the second and third signal.

According to the Applicant, in this way it is possible improving the adjustment of the duty cycle since the first signal, that is the input signal at the first port of the first differential amplifier, is generated by a processing of two signals (the second and third signal) one representative of the voltage at output from the converter and the other representative of the voltage at input into the converter, which are the two parameters on which the duty cycle depends. In this way, the second error signal that is used for the duty cycle adjustment, being function of the first signal, depends on both the voltage at output from the converter and the voltage at input into the converter allowing a better adjustment of the duty cycle and the stabilization of the operation of the optical amplification apparatus.

Preferably said first input port of said first differential amplifier and said first respective input port of said second differential amplifier are both inverting ports or both non-inverting ports.

Preferably said first commutator is selected in the group: MOSFET transistors, IGBT transistors (Insulated Gate Bipolar Transistor) or BJT transistors (Bipolar Junction Transistor).

Preferably said pulse modulator is selected in the group: pulse width modulators (PWM) or pulse frequency modulators (PFM).

Preferably said DC/DC converter comprises an inductor connected to said first commutator, more preferably upstream of said first commutator. Preferably said inductor is structured for storing current when said first commutator is in said closing configuration and for supplying current when said first commutator is in said opening configuration.

Preferably said DC/DC converter comprises a second commutator connected to said first commutator, more preferably downstream of said first commutator. Preferably said second commutator is selected in the group: classic diodes, Schottky diodes, MOSFET transistors.

Preferably said first commutator and/or said second commutator are a semiconductive component.

Preferably said second commutator is structured for allowing a current passage towards said optical amplification system when said first commutator is in said opening configuration and for blocking a current return towards said first commutator when said first commutator is in said closing configuration.

Preferably said DC/DC converter comprises an accumulator connected to said second commutator, more preferably downstream of said second commutator. Preferably said accumulator is structured for storing current when said first commutator is in said opening configuration and for supplying current when said first commutator is in said closing configuration. Preferably said accumulator is a capacitor. In this way it is possible ensuring the current power supplying of the optical amplification system in a continuous way and in both the configurations assumable by the first commutator.

Preferably said optical amplification apparatus comprises an equalizing filter connected upstream of said DC/DC converter for levelling a current at input into said DC/DC converter. Preferably said equalizing filter is selected in the group: capacitors, low-pass filters. In this way it is possible improving the operation of the amplification apparatus since the current at input into the DC/DC converter is uniform. For example, the equalizing filter makes the spiking current at output from a power supplying source of the optical amplification apparatus or at output from a precedent optical amplifier a uniform and constant direct current for the power supplying of the optical amplification system.

DETAILED DESCRIPTION OF SOME EMBODIMENTS OF THE PRESENT INVENTION

The features and the advantages of the present invention will be further clarified by the following detailed description of some embodiments of the present invention, presented by way of non-limiting example, with reference to the attached figures.

Figure 1:
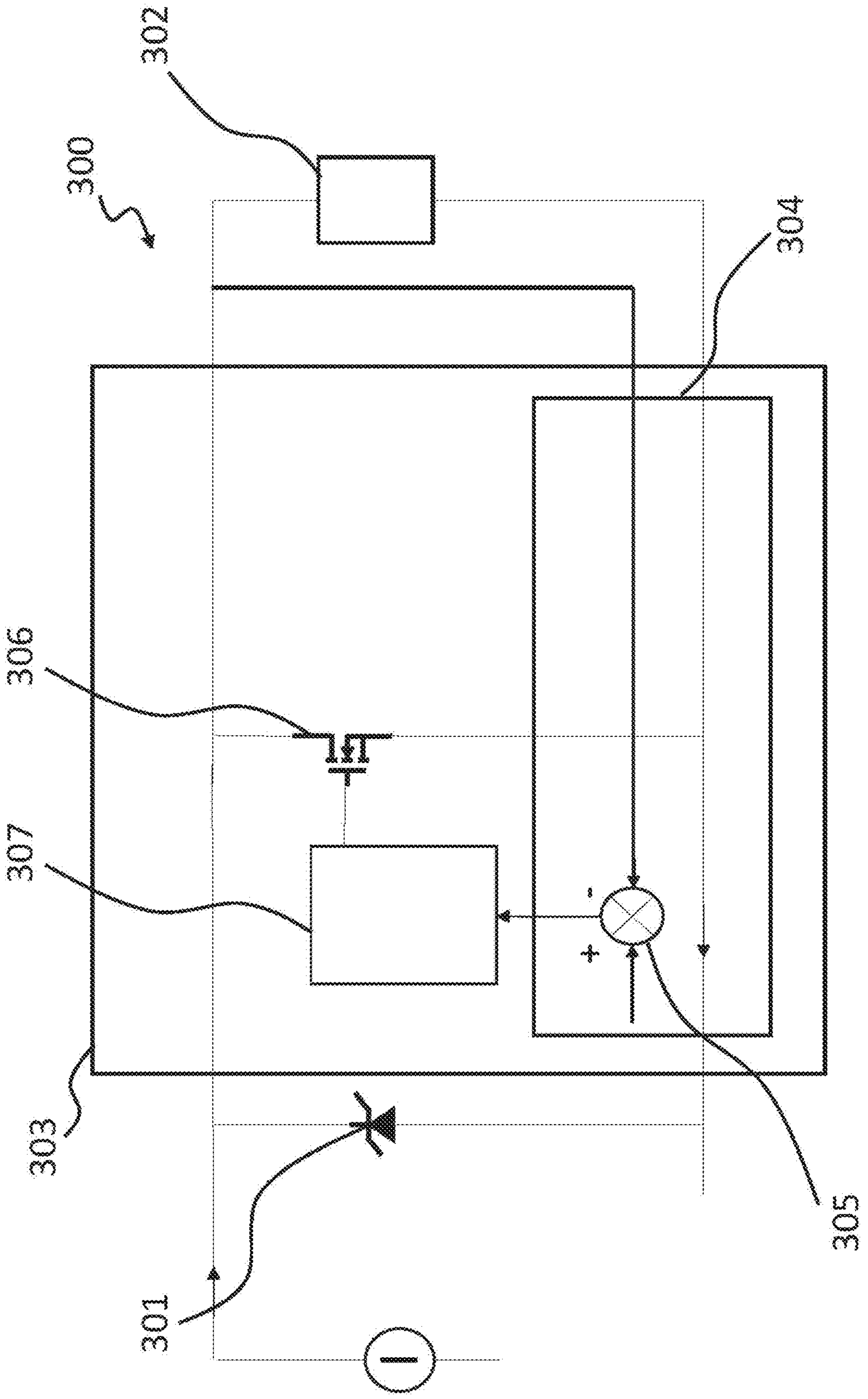
FIG. 1 (PRIOR ART)
FIG. 1 schematically shows an optical amplification apparatus for a submarine optical amplifier of known type.
Figure 2:
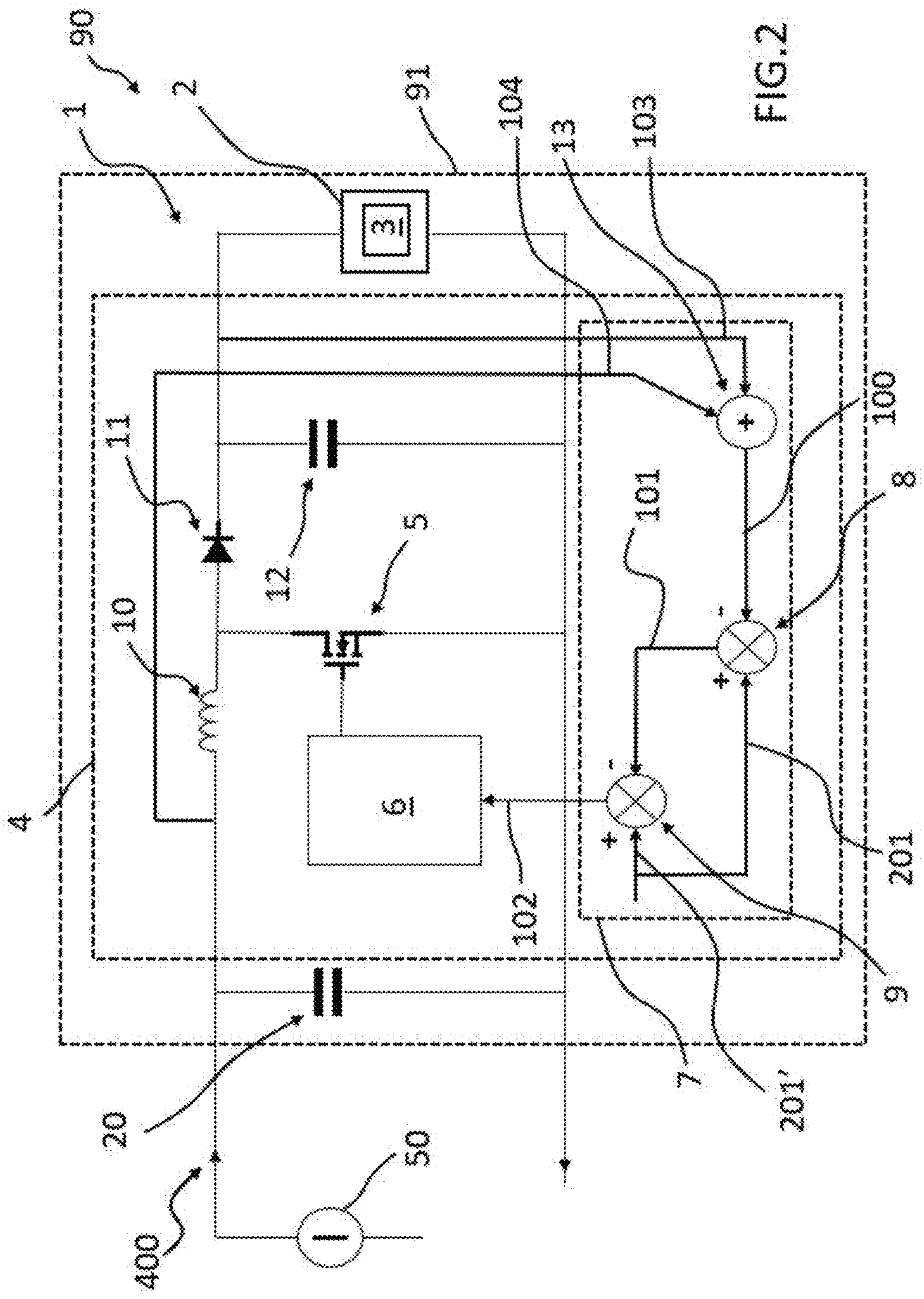
FIG. 2 schematically shows an optical amplification apparatus for a submarine optical amplifier according to an embodiment of the present invention.

FIG. 2 shows a submarine optical amplifier 90, comprising a vessel 91 (only schematically shown) having a housing cavity wherein an optical amplification apparatus 1 according to the present invention is housed. The power supplying of the optical amplification apparatus takes place remotely by the electric conductor of the optical transmission cable which is connected to the power supplying source 50 (PFE, "Power Feeding Equipment").

The optical amplification apparatus 1 comprises an optical amplification system 2 comprising a plurality of active components, indicated as a whole by the reference number 3, used for performing the processing (amplification, routing, regeneration etc.) of the optical signal. The amplification system is herein not further described and illustrated as known per se.

The optical amplification apparatus 1 comprises a DC/DC converter 4 connected to the optical amplification system 2 to supply the active components. Typically, the amplification system also includes further DC/DC converters (not shown) for the adaptation of the voltage at input into each component and/or group of components.

Exemplarily the optical amplification apparatus comprises an equalizing filter 20 connected upstream of the DC/DC converter 4.

Exemplarily the equalizing filter 20 consists of a single capacitor. Alternatively, not shown, the equalizing filter can consist of a plurality of capacitors connected in parallel to each other (for example for increasing the reliability and/or reducing costs).

Preferably the DC/DC converter 4 comprises a first commutator 5, exemplarily a MOSFET transistor.

Preferably the DC/DC converter 4 comprises a pulse modulator 6, exemplarily a pulse width modulator (PWM).

Preferably the pulse modulator 6 is connected to the first commutator 5 for cyclically switching with a duty cycle the first commutator between a closing configuration in which can be passed through by a current and an opening configuration in which cannot be passed through by the current. In an ideal circuit, the duty cycle is exclusively regulated according to the power variation required by the optical amplification system 2. On the other hand, considering a real circuit, the variation of the duty cycle is also influenced by other factors, such as the voltage drop across the diode 11 and the voltage drop on the drain of the MOSFET transistor 5, which are both variable as a function of the power supplying current and the working temperature.

The propagation direction of the current, to which the terms "upstream" and "downstream" hereinafter used refer to, is indicated by the reference number 400.

Exemplarily the DC/DC converter 4 shown in FIG. 2 is a "stepup"-type converter, which comprises:

- an inductor 10, exemplarily connected upstream of the first commutator 5;
- a second commutator 11, for example a schottky diode, exemplarily connected downstream of the first commutator 5. In case, for example, the DC/DC converter is used in a synchronous rectification configuration for improving the electric efficiency of the amplification apparatus, the second commutator could be a MOSFET transistor (not shown);
- an accumulator 12, for example a capacitor, exemplarily connected downstream of the second commutator 11.

Alternatively, to a "stepup"-type DC/DC converter, it is possible using, among others, "forward"-type DC/DC converters, "Flyback"-type DC/DC converters or "SEPIC"-type DC/DC converters (not shown).

In the following paragraphs, the power supplying mode of the optical amplification system 2 in an optical amplification apparatus that uses a "stepup"-type DC/DC converter is described.

The power supplying mode of the optical amplification system 2 depends on the configuration assumed by the MOSFET transistor 5. When the MOSFET transistor 5 is in the closing configuration (in which is comparable to a short circuit) the impedance of the MOSFET transistor 5 is much lower than the impedance of the components (i.e., the diode 11, the capacitor 12 and the optical amplification system 2) downstream of the transistor 5, thus causing substantially all the power supplying current to flow inside the MOSFET transistor 5 (except of small leakage currents which are absorbed by the circuit downstream of the MOSFET transistor). Across the inductor 10 there is a positive voltage difference (voltage at input into the inductor > voltage at output from the inductor) and the passage of the current inside the inductor 10 entails a variation (e.g., an increase) of the magnetic field around the coils of the inductor 10, with the consequent storage of electric energy as magnetic energy. The optical amplification system 2 is powered by the capacitor 12 which supply electric energy stored during the time interval wherein the MOSFET transistor 5 is in the opening configuration. The supplying of the energy stored by the capacitor 12 causes a lowering of the cathode voltage (in FIG. 2 the right end) of the diode 11 with respect to the anode voltage (in FIG. 2 the left end) of the diode 11, preventing a current return towards the MOSFET transistor.

When the MOSFET transistor 5 is in the opening configuration (in which is comparable to an open circuit), a variation of the magnetic field around the coils of the inductor 10 occurs and a polarity inversion across the inductor 10 (voltage at input into the inductor < voltage at output from the inductor, due to the reverse electro-motive force phenomenon). This polarity inversion allows a discharge of the energy stored inside the inductor 10 during the closing configuration of the MOSFET transistor 5, and parallelly an increase in the anode voltage of the diode 11 such as to exceed the cathode voltage value of the diode 11 which allows the current passage towards the optical amplification system 2. Part of the supplied current is stored inside the capacitor 12 for allowing the power supplying of the optical amplification system 2 when the MOSFET transistor 5 is in the opening configuration.

Preferably the DC/DC converter 4 comprises a retroaction circuit 7 which comprises:

- a first differential amplifier 8 connected for receiving at a first input port, for example the inverting port, a first signal 100, exemplarily representative of both a voltage at output from the DC/DC converter and a voltage at input into the DC/DC converter, and at a second input port, for example the non-inverting port, a first reference signal 201. Preferably the first differential amplifier 8 is structured for generating a first error signal 101 representative of a difference between the first signal 100 and the first reference signal 201;
- a second differential amplifier 9 connected to the first differential amplifier 8 for receiving at a respective first input port, for example the inverting port, the first error signal 101 and at a respective second input port, for example the non-inverting port, a second reference signal 201'. Preferably the second differential amplifier 9 is structured for generating a second error signal 102 representative of a difference between the first error signal 101 and the second reference signal 2012, wherein the second error signal 102 is proportional to a deviation of the voltage at output from said DC/DC converter 4 with respect to a nominal working voltage of the optical amplification system 2.

In the embodiment shown in FIG. 2, the second reference signal 201' at input at the second port of the second differential amplifier is the same as the first reference signal 201 at input at the second port of the first differential amplifier.

In one not shown alternative embodiment the second reference signal 201' at input at the second port of the second differential amplifier is different from the first reference signal 201 at input at the second port of the first differential amplifier.

Preferably the pulse modulator 6 is connected to the second differential amplifier 9 for receiving the second error signal 102 and for regulating the duty cycle as a function of the second error signal.

Exemplarily the retroaction circuit 7 also comprises an adder 13, for example of analogic type, connected to the first differential amplifier 8 for receiving at a first input port a second signal 103 representative only of the voltage at output from the DC/DC converter 4, and at a second input port a third signal 104 representative of the voltage at input into the DC/DC converter 4. For example, the second and third signals are voltage values respectively obtained by scaling (e.g., by a resistive divider) the voltage at output from the converter and the voltage at input into the converter.

Exemplarily the adder 13 is structured to operate a sum of the second 103 and third signal 104 and generate the first signal 100 as a function of the sum of the second 103 and third signal 104.

In use, as described above, the retroaction circuit 7 allows keeping the voltage at output from the DC/DC converter 4 at a constant value, equal to the nominal working voltage of the optical amplification system 2. The retroaction circuit 7 is made so that when the value of the voltage at output from the DC/DC converter 4 is equal to the value of the nominal working voltage of the optical amplification system 2, the first signal 100 assumes, for example, a reference value that, through the two difference operations, allows obtaining the first 101 and the second error signals 102, both also having a respective reference value for setting the duty cycle to the desired value.

In case, for example, the voltage at output from the DC/DC converter tends to decrease with respect to the nominal working voltage of the optical amplification system, the first signal 100 would have a lower value than the aforesaid reference value. This would generate at the output of the first differential amplifier 8 a first error signal 101 having a value greater than the respective reference value (since the first signal is compared with the first reference signal 201 which has a constant value). The subsequent difference operation performed by the second differential amplifier 9 would then generate a second error signal 102 having a lower value than the respective reference value, since the difference is performed with respect to the second reference signal 201' having a constant value. This second error signal 102 having a value lower than the respective reference value would command a decrease in the duty cycle which in a stepup-type DC/DC converter, wherein the relationship between voltage at input and voltage at output can be approximated with the formula Vin=Vout*(1-D), would lead to an increase in the voltage at input into the converter and consequently an increase in the voltage at output from the DC/DC converter which would tend to return to the value of the nominal working voltage of the optical amplification system 2.

In case, on the other hand, the voltage at output from the DC/DC converter tends to increase with respect to the nominal working voltage of the optical amplification system, the duty cycle would increase and a lowering of the voltage at output from the converter would occur.

What is claimed is:

1. An optical amplification apparatus for a submarine optical amplifier, wherein the optical amplification apparatus comprises:
- an optical amplification system, comprising at least one active component; and
- a DC/DC converter connected to supply the optical amplification system, wherein the DC/DC converter comprises:
  - a first commutator; and
  - a pulse modulator connected to the first commutator for cyclically switching the first commutator with a duty cycle between a closing configuration and an opening configuration, wherein in the closing configuration, the first commutator is configured to be passed through by a current, and wherein in the opening configuration, the first commutator is configured to prevent the current from passing through, wherein the DC/DC converter comprises a retroaction circuit comprising:
    - a first differential amplifier connected for receiving, at a first input port, a first signal representative of at least an output voltage from the DC/DC converter, wherein the output voltage is an input to the optical amplification system;
    - the first differential amplifier connected for receiving, at a second input port, a first reference signal, wherein the first differential amplifier is configured to generate a first error signal representative of a difference between the first signal and the first reference signal;
    - a second differential amplifier connected to the first differential amplifier for receiving, at a first respective input port, the first error signal; and
    - the second differential amplifier receiving at a second respective input port, a second reference signal wherein the second differential amplifier is configured to generate a second error signal representative of a difference between the first error signal and the second reference signal, wherein the second error signal is proportional to a deviation of the output voltage from the DC/DC converter with respect to a nominal working voltage of the optical amplification system, wherein:

the first input port of the first differential amplifier and the first respective input port of the second differential amplifier are concordant ports, wherein the first input port of the first differential amplifier and the first respective input port of the second differential amplifier are inverting ports, such that an increase in the output voltage from the DC/DC converter results in a corresponding adjustment of the duty cycle by the pulse modulator to counteract the increase in the output voltage; and the pulse modulator is connected to the second differential amplifier for receiving the second error signal and for regulating the duty cycle as a function of the second error signal, wherein, the second error signal commands, in response to the deviation of the output voltage from the DC/DC converter, a variation of an input voltage to the DC/DC converter discordant with respect to the deviation.

2. The optical amplification apparatus according to claim 1, wherein the first signal is representative of a sum of the output voltage from the DC/DC converter and the input voltage to the DC/DC converter.

3. The optical amplification apparatus according to claim 1, wherein the retroaction circuit comprises an adder connected to the first differential amplifier to receive:

at a respective first input port of the adder, a second signal representative of the output voltage from the DC/DC converter; and at a respective second input port of the adder, a third signal representative of the input voltage to the DC/DC converter, wherein the adder is configured to sum the second and the third signal and generate the first signal as a function of the sum of the second and the third signal.

4. The optical amplification apparatus according to claim 1, wherein the first commutator is selected from a group consisting of MOSFET transistors, IGBT transistors or BJT transistors.

5. The optical amplification apparatus according to claim 1, wherein the pulse modulator is selected from a group consisting of pulse width modulators and pulse frequency modulators.

6. The optical amplification apparatus according to claim 1, wherein the DC/DC converter comprises an inductor connected upstream of the first commutator, wherein the inductor is configured to store the current when the first commutator is in the closing configuration and to supply the current when the first commutator is in the opening configuration.

7. The optical amplification apparatus according to claim 1, wherein the DC/DC converter comprises a second commutator connected downstream of the first commutator, wherein the second commutator is configured to allow the current to flow towards the optical amplification system when the first commutator is in the opening configuration and to block the current from flowing back towards the first commutator when the first commutator is in the closing configuration, wherein the second commutator is selected from the group consisting of classic diodes, Schottky diodes, MOSFET transistors.

8. The optical amplification apparatus according to claim 1, wherein the DC/DC converter comprises a second commutator connected downstream of the first commutator and an accumulator connected downstream of the second commutator, wherein the accumulator is configured for storing the current when the first commutator is in the opening configuration and for supplying the current when the first commutator is in the closing configuration, wherein the accumulator is a capacitor.

9. The optical amplification apparatus according to claim 1, comprising an equalizing filter connected upstream of the DC/DC converter for levelling the current at the input of the DC/DC converter, wherein the equalizing filter is selected from the group consisting of capacitors and low-pass filters.

10. The submarine optical amplifier comprising:

a vessel having a housing cavity; and the optical amplification apparatus according to claim 1 disposed within the housing cavity.

11. The optical amplification apparatus according to claim 1, wherein the second differential amplifier is configured to generate the second error signal as a successive difference of the first error signal and the second reference signal, such that the second error signal represents a difference of a difference relative to the first signal and the first reference signal.

12. The optical amplification apparatus according to claim 1, wherein the concordant ports are both inverting input ports, such that the first error signal and the second error signal are generated with a consistent polarity inversion relative to their respective input signals.

* * * * *